US009153943B2

(12) United States Patent
Stoppel et al.

(10) Patent No.: US 9,153,943 B2
(45) Date of Patent: *Oct. 6, 2015

(54) METHOD FOR PRODUCING A LIGHT SOURCE HAVING A DIODE LASER AND A PLURALITY OF OPTICAL FIBERS

(75) Inventors: Klaus Stoppel, Mundelsheim (DE); Werner Herden, Gerlingen (DE); Hans-Jochen Schwarz, Stuttgart (DE); Andreas Letsch, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 1059 days.

This patent is subject to a terminal disclaimer.

(21) Appl. No.: 13/255,626
(22) PCT Filed: Feb. 17, 2010
(86) PCT No.: PCT/EP2010/051984
§ 371 (c)(1), (2), (4) Date: Nov. 22, 2011
(87) PCT Pub. No.: WO2010/102884
PCT Pub. Date: Sep. 16, 2010

(65) Prior Publication Data
US 2012/0068369 A1    Mar. 22, 2012

(30) Foreign Application Priority Data
Mar. 11, 2009 (DE) .......................... 10 2009 001 478

(51) Int. Cl.
G02B 6/04       (2006.01)
B29D 11/00      (2006.01)
(Continued)

(52) U.S. Cl.
CPC ............... *H01S 5/4025* (2013.01); *F02P 23/04* (2013.01); *G02B 6/4236* (2013.01);
(Continued)

(58) Field of Classification Search
USPC .............. 264/1.1, 1.28, 2.7; 65/385, 386, 403
IPC .................... F02P 23/04; H01S 5/4025,5/4031, H01S 3/113; G02B 6/4203, 6/4236, 6/4249, G02B 6/4296
See application file for complete search history.

(56) References Cited

U.S. PATENT DOCUMENTS 5,389,193 A *  2/1995  Coucoulas et al. ............. 216/24
8,761,222 B2 * 6/2014  Stoppel et al. .................. 372/70
(Continued)

FOREIGN PATENT DOCUMENTS

| DE | 102004006932 | 10/2005 |
| DE | 102005057617 | 6/2007 |
| DE | 102007061655 | 8/2009 |
| JP | 57 046210 | 3/1982 |
| JP | 6317716 | * 11/1994 |

(Continued)

OTHER PUBLICATIONS

International Search Report, PCT International Patent Application No. PCT/EP2010/051984, dated May 27, 2010.

*Primary Examiner* — Mathieu Vargot
(74) *Attorney, Agent, or Firm* — Kenyon & Kenyon LLP

(57) ABSTRACT

A method is described for producing a light source, in particular a light source for optically exciting a laser device, for example a laser device of a laser ignition system of an internal combustion engine, including a diode laser having a plurality of emitters and a fiber optic device. The fiber optic device includes a plurality of optical fibers, each fiber having a first end and a lateral surface area. The first ends are situated relative to the emitters in such a way that light generated by the emitters is injected into the first ends of the optical fibers. The optical fibers are situated in abutment along their lateral surface areas, at least in the region of the first ends of the optical fibers. The method is characterized by the following steps: arranging a plurality of optical fibers which form a fiber section in a subregion, the fiber section being situated between two opposite pressing surfaces; heating the fiber section; and exerting a force on the heated optical fibers with the aid of the pressing surfaces. The force and the heating initially result in deformation of the heated optical fiber. The exerted force and/or a temperature of the optical fibers is/are selected in such a way that the deformation ceases when the optical fibers for the first time fill, at least largely, a region between the pressing surfaces.

13 Claims, 11 Drawing Sheets

(51) Int. Cl.
  *H01S 5/40* (2006.01)
  *F02P 23/04* (2006.01)
  *G02B 6/42* (2006.01)
  *H01S 3/113* (2006.01)

(52) U.S. Cl.
  CPC ............ *G02B 6/4203* (2013.01); *G02B 6/4249* (2013.01); *G02B 6/4296* (2013.01); *H01S 3/113* (2013.01); *H01S 5/4031* (2013.01)

(56) References Cited

U.S. PATENT DOCUMENTS

2004/0234202 A1 11/2004 Sato et al.
2009/0169160 A1 7/2009 Weingartner et al.
2010/0202733 A1 8/2010 Herden

FOREIGN PATENT DOCUMENTS

WO   WO 2009037036   3/2009

\* cited by examiner 121, 1213 1214 1215
1211,
1216

METHOD FOR PRODUCING A LIGHT SOURCE HAVING A DIODE LASER AND A PLURALITY OF OPTICAL FIBERS

FIELD OF THE INVENTION

The present invention relates to a method for producing a light source.

BACKGROUND INFORMATION

A light source is described in German Patent Application No. DE 10 2004 006 932 B3, which has a diode laser bar having a plurality of narrow emitters situated adjacently in a row in the direction of their longitudinal axis. Associated with the diode laser bar is a device for beam guiding and beam shaping of the laser beam which exits the diode laser bar, the device containing a plurality of optical fibers, situated adjacently in a row, into which the laser beam is injected.

German Patent Application No. DE 10 2004 006 932 B3 also describes producing such a light source by adjacently arranging circular optical fibers and inserting them with their end region into a mold in which they are brought into a rectangular cross section using a hot press method, the extension of the fibers in a first direction remaining approximately unchanged while the extension of the fibers in a second direction is reduced by approximately 25%.

In the industrial use of such methods, it is very important that the fibers are actually shaped to the desired degree, while at the same time excessive squeezing of the fibers is reliably prevented.

An object of the present invention is to provide a method which ensures a defined shaping of the fibers with high accuracy.

SUMMARY

In accordance with the present invention, a light source is provided, in particular a light source for optically exciting a laser device, for example a laser device of a laser ignition system of an internal combustion engine, including a diode laser having a plurality of emitters and a fiber optic device, the fiber optic device including a plurality of optical fibers, and each fiber having a first end and a lateral surface area, the first ends being situated relative to the emitters in such a way that light generated by the emitters is injected into the first ends of the optical fibers, the optical fibers being situated in abutment along their lateral surface areas, at least in the region of the first ends of the optical fibers, the example production method having the following steps:
  arranging a plurality of optical fibers which form a fiber section in a subregion, the fiber section being situated between two opposite pressing surfaces;
  heating the fiber section; and
  exerting a force on the heated optical fibers with the aid of the pressing surfaces, the force and the heating initially resulting in deformation of the heated optical fibers, the exerted force and/or a temperature of the optical fibers being selected in such a way that the deformation ceases when the optical fibers for the first time fill, at least largely, a region between the pressing surfaces.

A first end of an optical fiber is understood to mean an end of an optical fiber in the direction of its longitudinal axis—for a cylindrical optical fiber, for example, a base area of the cylinder. A lateral surface area of an optical fiber is understood to mean the area which delimits an optical fiber perpendicular to its longitudinal axis—for a cylindrical optical fiber,
for example, the lateral area of the cylinder. Optical fibers which are situated in abutment along their lateral surface areas are understood to mean the optical fibers of which all or almost all, for example more than 90% of the optical fibers, directly contact adjacent optical fibers along their lateral surface areas.

The example method is based on the finding that for optical fibers situated in abutment between two pressing surfaces, free volumes are initially present in the region of the optical fibers between the pressing surfaces, and that it is possible to find such process parameters for which the optical fibers may be shaped in the initially free volumes, but further shaping does not occur when the optical fibers for the first time fill, at least largely, a region between the pressing surfaces.

These process parameters may include one or all of the following variables, for example: the minimum temperature of the fibers during the shaping, the maximum temperature of the fibers during the shaping, the minimum force between the pressing surfaces during the shaping, and the maximum force between the pressing surfaces during the shaping. It is particularly advantageous when heating of the optical fibers is provided at least up to a minimum temperature, and pressing of the optical fibers via the pressing surfaces is provided at least with a minimum force, and the minimum force and the minimum temperature are selected in such a way that shaping of the optical fibers is possible, whereby when the optical fibers for the first time fill, at least largely, the region between the pressing surfaces, further deformation of the optical fibers ceases, that heating of the optical fibers is provided up to a maximum temperature, and pressing of the fibers via the pressing surfaces is provided up to a maximum force, and the maximum force and the maximum temperature are selected in such a way that further shaping of the optical fibers is prevented when the optical fibers fill at least largely a region between the pressing surfaces.

In particular, it is advantageously possible to carry out the method in such a way that the deformation ceases without requiring a change in the acting force or the temperature, and/or that the deformation ceases while the exerted force and/or a temperature of the fibers is/are held generally constant.

It is provided in particular that the optical fibers are situated in abutment along their lateral surface areas, at least in the fiber section.

It is provided in particular that the deformation of the heated optical fibers ceases when more than 95%, in particular more than 99.5%, of a region between the pressing surfaces is filled.

At least one of the pressing surfaces is advantageously part of a fiber support, resulting in the formation of a connection, in particular a formation of an integral connection between the optical fibers and the fiber support.

Alternatively or additionally, it is advantageous that one of the pressing surfaces is part of a fiber support, and the other, opposite pressing surface is part of a second fiber support, resulting in the formation of a connection, in particular a formation of an integral connection between the optical fibers and the second fiber support.

On the other hand, it is preferred that a direct, in particular integral, connection between the fiber support and the second fiber support is avoided.

For improving the accuracy of the shaping of the optical fibers, it is advantageous when the optical fibers are made of one or multiple first glasses, and when the fiber support or the fiber supports is/are made of one or multiple second glasses, and when the softening temperature of the second glass or the softening temperatures of the second glasses has/have a higher value than the softening temperature of the first glass or the softening temperatures of the first glasses. When the glasses are appropriately selected, it is thus ensured that shaping of the fibers, but not of the fiber supports, occurs under the action of the force. The softening temperatures of the first and the second glasses preferably differ by more than 20 K.

It is also preferred that the optical fibers are made of one or multiple first glasses, and the fiber support or the fiber supports is/are made of one or multiple second glasses, and that the hardness at room temperature of the second glass or the hardnesses at room temperature of the second glasses has/have a higher value than the hardness at room temperature of the first glass or the hardnesses at room temperature of the first glasses.

In alternative embodiments, one or both of the pressing surfaces is/are made of at least one heat-resistant material, for example SiC, which does not form a connection with the optical fibers, even at temperatures of 800° C.

In one embodiment it is provided that the heating of the arranged optical fibers is carried out within the fiber section in which the optical fibers are heated across at least one, in particular across both, of the pressing surfaces, in particular with the aid of at least one electrical resistance heater. Alternatively or additionally, an induction heater may be used, thus shortening the heat-up time.

DETAILED DESCRIPTION OF EXAMPLE EMBODIMENTS

Figure 1:
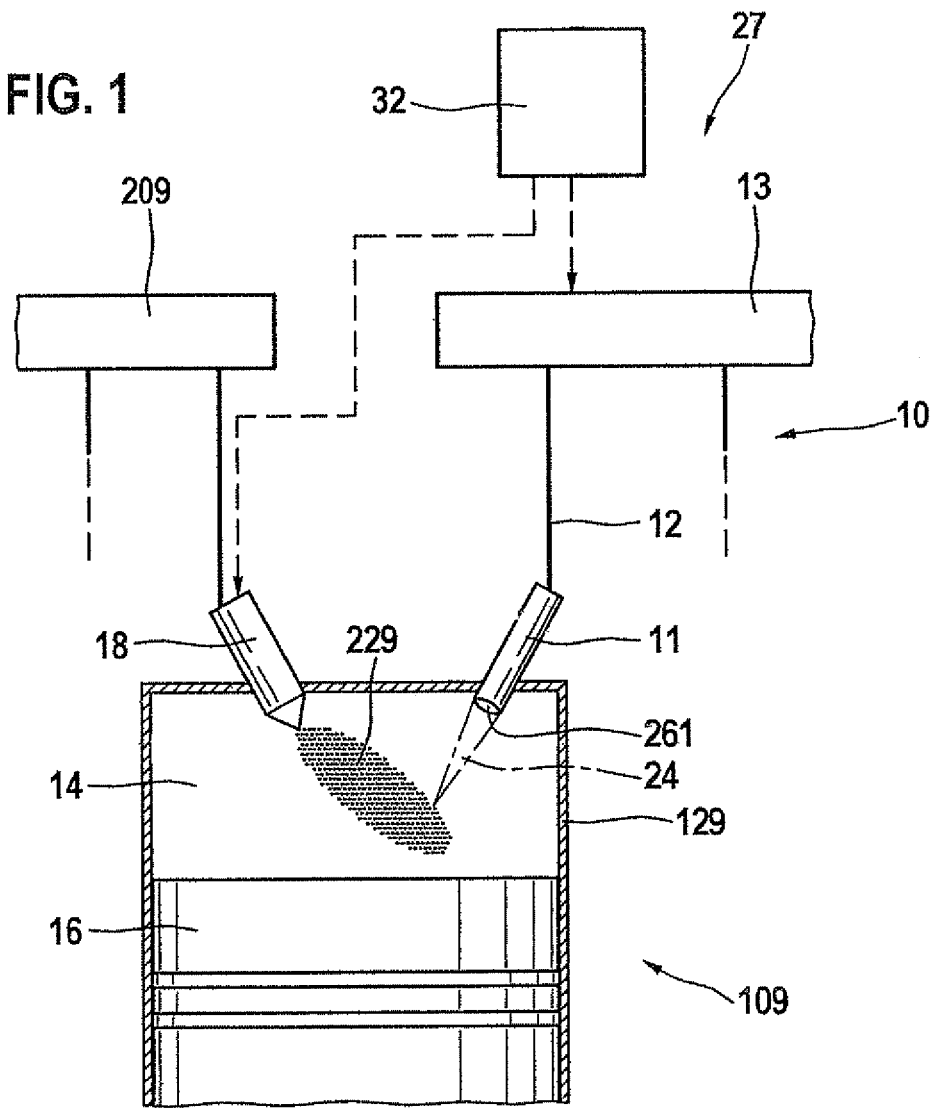
FIG. 1 shows a schematic illustration of an internal combustion engine having a laser ignition device.

An internal combustion engine is indicated overall by reference numeral 109 in FIG. 1. The internal combustion engine is used to drive a motor vehicle, not illustrated, or a generator, likewise not illustrated. Internal combustion engine 109 includes multiple cylinders 129, of which one is shown in FIG. 1. A combustion chamber 14 of cylinder 129 is delimited by a piston 16. Fuel 229 enters combustion chamber 14 directly through an injector 18 which is connected to a fuel pressure accumulator 209.

Fuel 229 injected into combustion chamber 14 is ignited using a laser pulse 24 which is irradiated into combustion chamber 14 by an ignition device 27 which includes a laser device 11, and which is focused using a focusing lens 261. Laser device 11 is supplied with pumped light from a light source 10 via an optical fiber device 12. Light source 10 is controlled by a control and regulation device 32, which also activates injector 18.

In addition to optical fiber device 12, light source 10 includes a diode laser 13 which via optical fiber device 12 emits appropriate pumped light to laser device 11 as a function of a control current.

Figure 2:
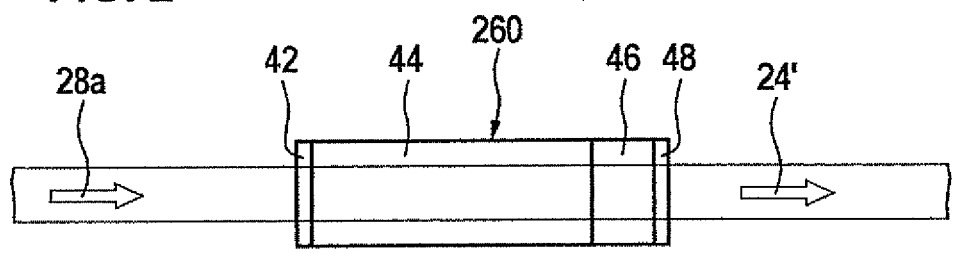
FIG. 2 schematically shows a laser ignition device in detail.

FIG. 2 schematically shows a detailed view of solid state laser 260 of laser device 11 from FIG. 1. As shown in FIG. 2, solid state laser 260 has a laser-active solid body, referred to below as a laser crystal 44, in the optical path downstream from which a crystal (passive Q-switch 46), also referred to as a Q-switch, is situated. Solid state laser 260 also has an input mirror 42 and an output mirror 48. In the present example the components of solid state laser 260 have a monolithic design; i.e., they are largely undetachably connected to one another, for example by bonding and/or coating.

To generate a laser pulse, also referred to as a giant pulse, laser crystal 44 is acted on by pumped light 28a passing through input mirror 42, resulting in optical pumping and formation of a population inversion in laser crystal 44. Passive Q-switch 46 is initially in its rest state, in which it has a relatively low transmission of the light to be generated by laser device 11. The process of the stimulated emission, and therefore the generation of laser radiation, is initially suppressed in this way. However, with increasing pumping duration, i.e., while pumped light 28a is acting, the radiation intensity in solid state laser 260 increases, ultimately causing passive Q-switch 46 to fade. The transmission of the passive Q-switch abruptly increases, and the generation of laser radiation begins. This state is indicated by double arrow 24'. During the laser operation, due to the effect of the stimulated emission, there is a rapid reduction in the population inversion present in laser crystal 44, so that the emission of solid state laser 260 typically ceases after several nanoseconds, and subsequently transmission of Q-switch 46 also typically drops to its original low value.

In the manner described above, a laser pulse 24, also referred to as a giant pulse, results which has a relatively high peak output. Laser pulse 24 is injected into combustion chamber 14 (FIG. 1) of internal combustion engine 109, optionally using a further optical fiber device (not shown), or also directly through a combustion chamber window (likewise not shown) of laser device 11, so that fuel 229 or an air-fuel mixture present therein is ignited.

FIGS. 3a, 3b, 3c, and 3d show a schematic view of one exemplary embodiment of a light source 10. Diode laser 13 included in light source 10 has the design of a so-called diode laser bar. Thus, the diode laser has a plurality of adjacently situated emitters 131. Emitters 131 have a lateral surface area 1310 through which the light generated by emitters 131 exits. This lateral surface area 1310 typically has an approximately rectangular shape having a short first side 1311 (1 μm long, for example), usually referred to as the fast axis, and a longer second side 1312 (10 μm-500 μm long, for example), usually referred to as the slow axis. Regions from which no light is emitted, referred to as separating trenches, are located between emitters 131 which are adjacently situated in a layer plane in the direction of the slow axis. The light which is generated by emitters 131 and which exits from lateral surface areas 1310 in each case has the shape of a light cone, the half opening angle of the light cone in the plane of the fast axis typically being in the range of 30° to 60°, and generally being much larger than the opening angle of the light cone in the plane of the slow axis, which typically is only a few degrees.

Although diode laser 13 has the design of a so-called diode laser bar in the present example, the present invention is not limited to such a design, and also includes, for example, diode lasers 13 having different configurations of emitters 131, for example configurations having emitters 131 in multiple layer planes, these layer planes being offset with respect to one another, for example, by several microns in the direction of the fast axis, for example so-called diode laser stacks or nanostacks.

Optical fiber device 12 included in light source 10 likewise has a plurality of fibers 121, also referred to as optical fibers 121, each fiber 121 having a first end 1211 and a second end 1212. Fibers 121 are adjacently situated in one layer in the region of their first ends 1211. In addition, fibers 121 are situated in the region of their first ends 1211 in such a way that end faces 1216 of fibers 121 associated with first ends 1211 are jointly situated in one plane. In addition, in the region of their first ends 1211, fibers 121 are situated in abutment along their lateral surface areas 1217, i.e., are arranged in such a way that all fibers 121 or almost all fibers 121, for example more than 90% of fibers 121, directly contact adjacent fibers 121 in the region of their first ends 1211.

In the present example, end faces 1216 of fibers 121 have a generally rectangular shape, and cross sections of fibers 121 likewise have a generally rectangular shape in the region of their first ends 1211. In the region of their first ends 1211, fibers 121 make planar contact along approximately flat regions of lateral surface areas 1217 of fibers 121. However, the present invention of course is not limited to fibers 121 which have generally rectangular cross sections in the region of their first ends 1211. These cross sections may also have a trapezoidal shape or have curved sides, it being preferred that in the region of their first ends 1211 fibers 121 make planar contact along their lateral surface areas 1217, and that end faces 1216 of fibers 121 jointly lie in one plane, end faces 1216 of fibers 121 jointly lying as close together as possible, i.e., without inclusion of free areas.

End faces 1216 of fibers 121 and cross sections of fibers 121 have areas which are at least largely the same, preferably between 3000 $\mu m^2$ and 5000 $\mu m^2$. End faces 1216 of fibers 121 and cross sections of fibers 121 which are situated in the region of first ends 1211 of fibers 121 preferably have the shape of a rectangle, whose side lengths have a ratio of approximately 0.78 or $\pi/4$, fibers 121 preferably contacting one another along the short sides of the rectangle. Within the scope of the present invention, a cross section of a fiber 121 is understood to mean a cross section perpendicular to longitudinal axis 1219 of fiber 121.

Fibers 121 are made of at least one glass, each individual fiber 121 preferably being made of at least two different glasses. Examples of types of glass used include so-called optical flints and/or soda-lime glasses.

Figure 4:
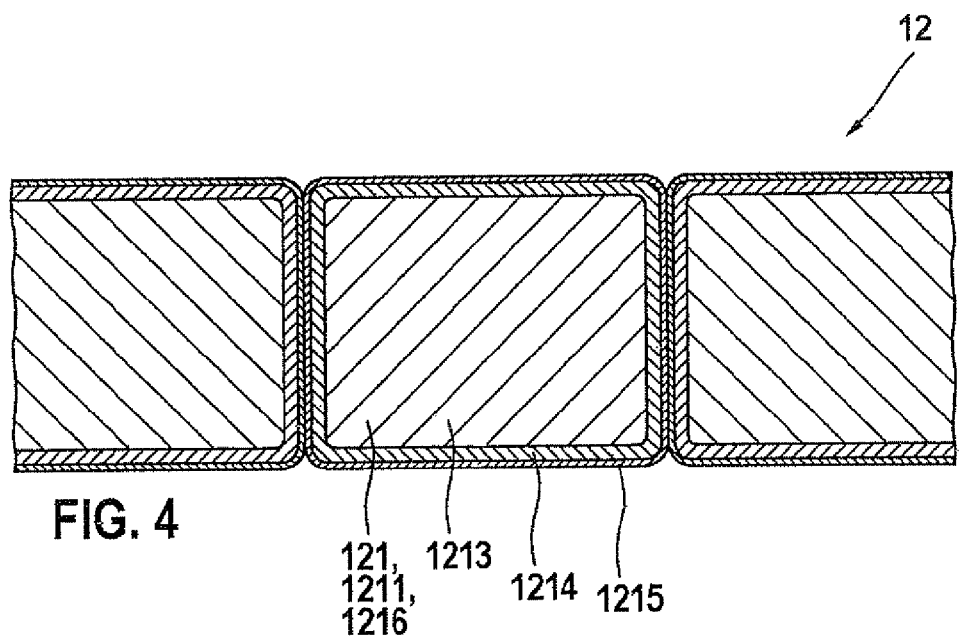
FIGS. 4 and 4a schematically show the design and configuration of optical fibers.

FIG. 4 shows a detail of optical fiber device 12, in particular of end faces 1216 associated with first ends 1211 of fibers 121, which represent cross sections of fibers 121 in the region of their first ends 1211. In the cross section, i.e., along end face 1216, of a fiber 121, a fiber core 1213 centrally situated in fiber 121 as well as a fiber shell 1214 which encloses fiber core 1213 laterally, i.e., perpendicular to longitudinal axis 1219 of fibers 121, are visible. Also visible in the cross section, i.e., along end face 1216, of a fiber 121 is a fiber sheathing 1215 which laterally encloses fiber shell 1214. In the present example, end face 1216 of fiber 121 as well as cross sections of fibers 121 in the region of their first ends 1211 have an almost rectangular shape. Likewise, in the region of first end 1211 of fibers 121, cross sections of fiber core 1213 and of the structure composed of fiber core 1213 and fiber shell 1214 and of the structure composed of fiber core 1213 and fiber shell 1214 and fiber sheathing 1215 have almost rectangular cross sections.

It is provided that the thickness of fiber shell 1214, at least in the region of first ends 1211 of fibers 121, is small compared to the cross-sectional area of fiber core 1213, in particular compared to the square root of the cross-sectional area, thus ensuring that a high percentage of the emission of diode laser 13 is injected into fiber cores 1213, where it may be guided with low losses.

To accomplish that the light, which is still injected into fiber shell 1214 of a fiber 121, is guided, at least partially, at that location to second end 1212 of fiber 121, it is additionally or alternatively provided that fiber core 1213 is made of a first material, fiber shell 1214 is made of a second material, and fiber sheathing 1215 is made of a third material, the first material for the light generated by diode laser 13, whose wavelength is 808 nm, for example, having an index of refraction $n_1$, the second material for the light generated by diode laser 13 having an index of refraction $n_2$, and the third material for the light generated by diode laser 13 having an index of refraction $n_3$, where $n_1 > n_2 > n_3 > 1$.

In the present example, in the region of first ends 1211 of fiber 121, fiber core 1213 has an almost rectangular shape and edge lengths of 60 μm and 77 μm, fiber shell 1214 forms a layer approximately 2 μm thick, and fiber sheathing 1215 forms a layer approximately 0.05 μm thick. The first material, the material of fiber core 1213, is a glass having an index of refraction between 1.5 and 1.6, for example optical flint. The second material, the material of fiber shell 1214, is a glass having an index of refraction between 1.4 and 1.5, for example soda-lime glass. The third material, the material of fiber sheathing 1215, is a plastic and has an index of refraction between 1.15 and 1.35. Fiber sheathing 1215 has the additional function of improving the stability of fibers 121. Fiber sheathing 1215 may be a coating composed of lacquer (acrylate or plastic).

Figure 4A:
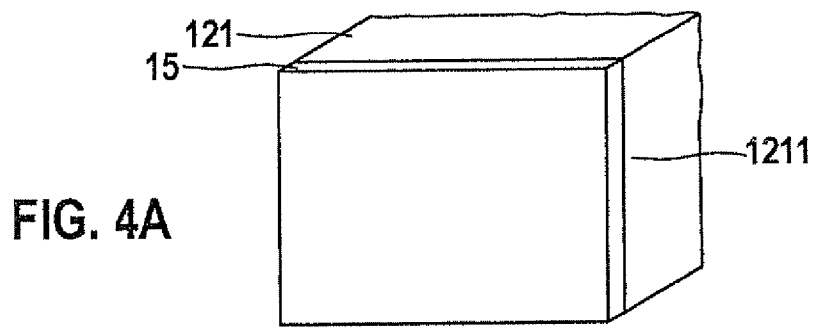

First ends 1211 and/or second ends 1212 of fibers 121 may have a finish coating and/or, as illustrated in FIG. 4a, an antireflective coating 15. Such a finish coating and/or such an antireflective coating 15 is designed in such a way that it/they reduce(s) optical losses upon entry into/exit from optical fiber device 12.

Figure 4B:
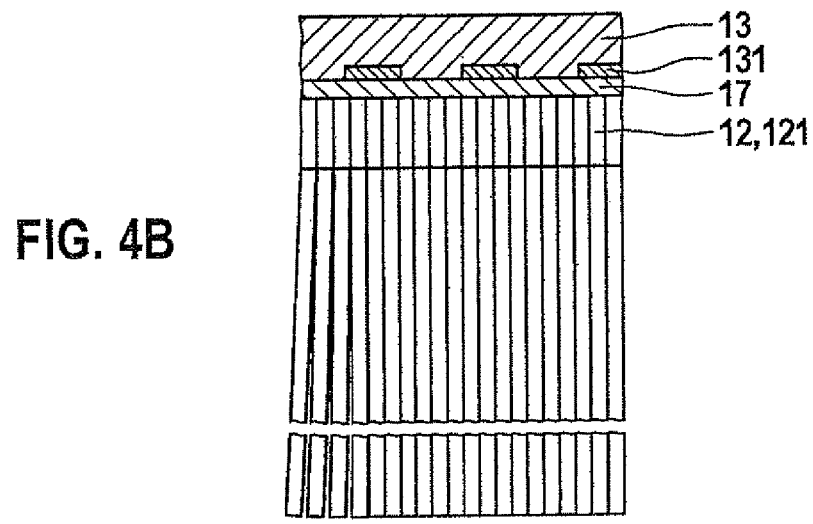
FIG. 4b schematically Shows one example of the configuration of the optical fiber device and the diode laser.

Alternatively or additionally, as schematically illustrated in FIG. 4b, it is possible to completely fill a space between first ends 1211 of the fibers and emitters 131 of diode laser 13 with an optically homogeneous medium 17, for example an optical gel, preferably a gel which reduces optical losses during injection of the light generated by emitters 131 of diode laser 13 into fibers 121, and/or which has an index of refraction which is equal or approximately equal to index of refraction $n_1$ of the fiber core, for example differing by no more than 15%.

Alternatively or additionally, first ends 1211 of fibers 121 may be situated at a distance of 1 μm to 10 μm in front of emitters 131 of diode laser 13.

Figure 3:
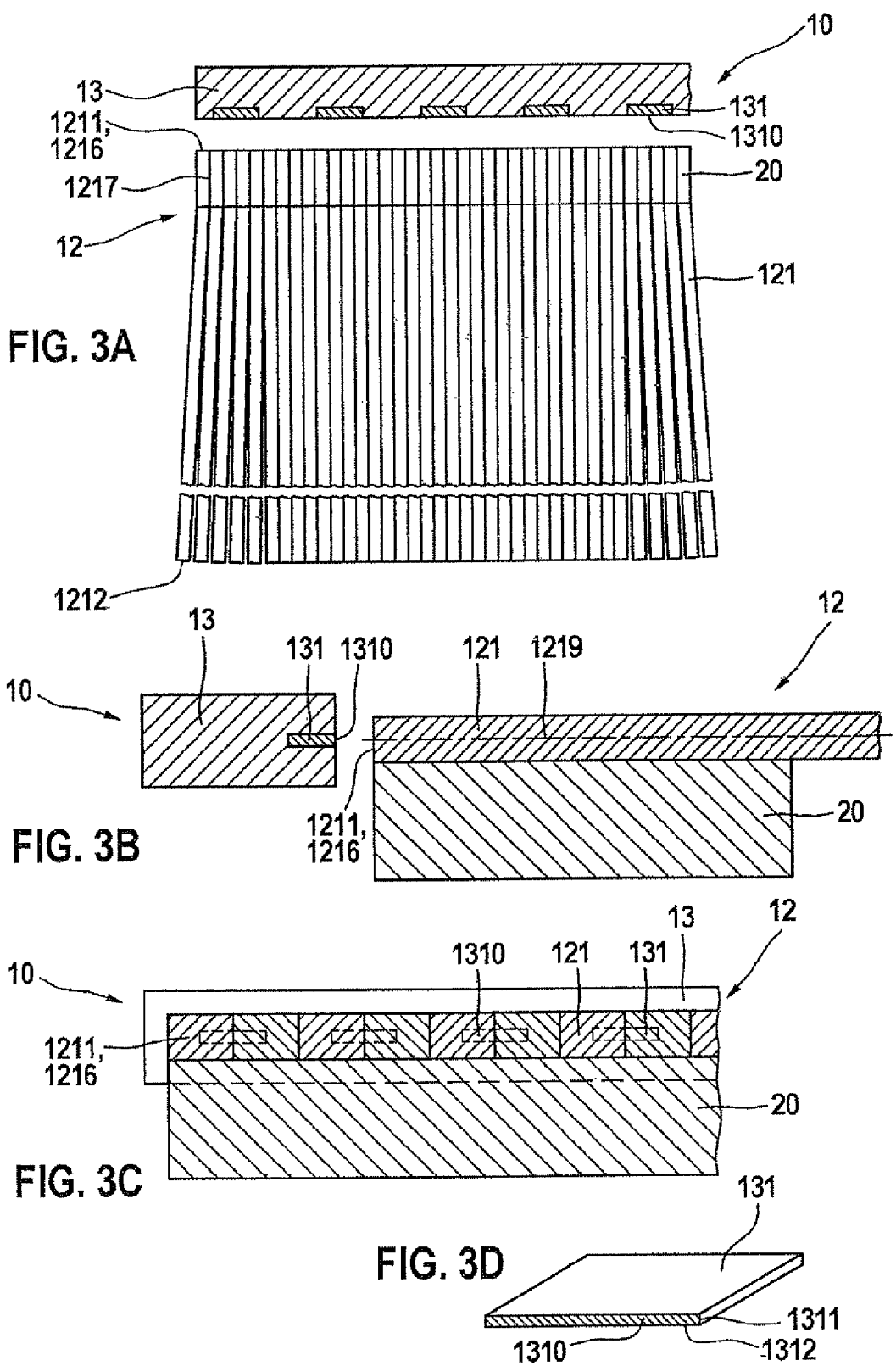
FIGS. 3a, 3b, 3c, and 3d schematically show one example of a light source.

As is apparent in FIGS. 3a, 3b, and 3c, fibers 121 are connected to a fiber support 20 in the region of their first ends 1211. Fiber support 20 used in the present example has the shape of a cuboidal disk extending over the width in which fibers 121 are situated, for example approximately 20 mm, and has a length, oriented in the direction of longitudinal axes 1219 of fibers 121, of 1 mm to 20 mm, for example to 10 mm. On its side facing diode laser 13, fiber support 20 is in flush abutment with end faces 1216 of fibers 121. The height of fiber support 20 is in the range of several tenths of a millimeter to several millimeters, and is typically several times greater than the height of fibers 121.

Fiber support 20 is made of a glass, and is integrally joined to fibers 121 in the region of their first ends 1211. Fiber support 20 is made of a glass which, compared to the type of glass or the types of glass of which fibers 121 are made, has a lower hardness at room temperature, a comparable coefficient of thermal expansion, and/or a higher softening temperature. Float glasses represent one example of types of glass used.

The "region," which in the present case is denoted as the region of first ends 1211 of fibers 121, is understood to mean the region of fibers 121 in which fibers 121 are situated on fiber support 20.

The composite of fibers 121 and fiber support 20 is fixed relative to diode laser 13, for example with the aid of an adhesive. Another option is to achieve fixing by clamps so that they may be removed at a later point in time, for example for disassembly or readjustment.

Figure 5A:
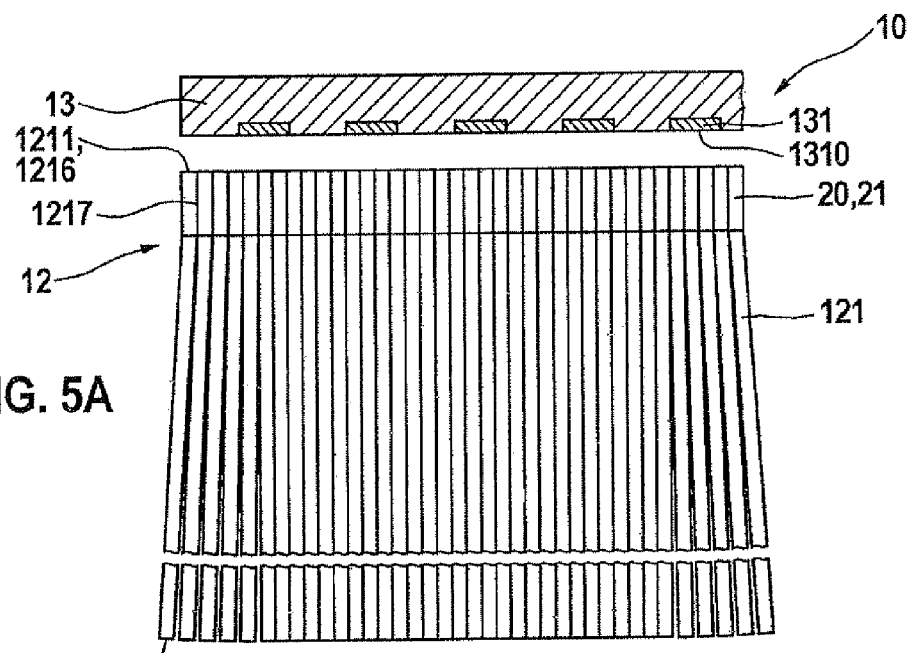
FIGS. 5a, 5b, and 5c schematically show another example of a light source.
Figure 5B:
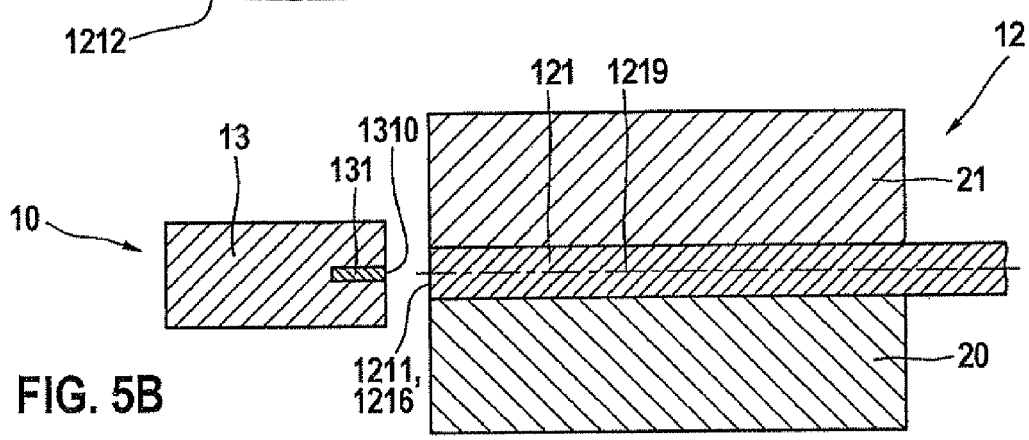
Figure 5C:
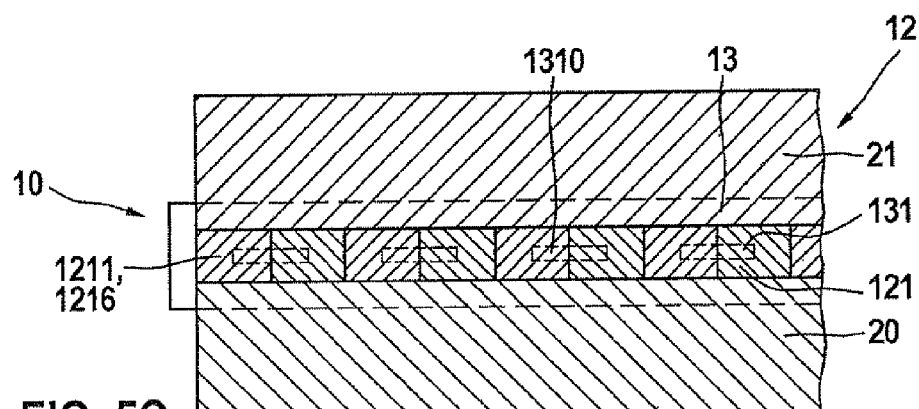

Another specific embodiment is illustrated in FIGS. 5a, 5b, and 5c. This further specific embodiment differs from the specific embodiment illustrated in FIGS. 3a, 3b, and 3c in that in the region of their first ends 1211, fibers 121 are situated not only on a fiber support 20 but also between fiber support 20 and a second fiber support 21. Fiber support 20 and second fiber support 21 each have the shape of a cuboidal glass disk, and are the same size, for example. For example, fiber support 20 and second fiber support 21 have the same dimensions as stated for fiber support 20 in the preceding example.

An integral connection exists between fiber supports 20, 21 and fibers 121, and fiber support 20 as well as fiber support 21 are in flush abutment with end faces 1216 of fibers 121.

On the one hand, the area of fiber support 20 facing fibers 121 and the area of second fiber support 21 facing fibers 121 may be parallel to one another, so that the gap remaining between fiber supports 20, 21 has a uniform height. Alternatively, the area of fiber support 20 facing fibers 121 and the area of second fiber support 21 facing fibers 121 are tilted relative to one another in such a way that the gap remaining between fiber supports 20, 21 in the region of end faces 1216 of fibers 121 has a lower height than in the region of fiber supports 20, 21 opposite from end faces 1216 of fibers 121. Tilting about an angle of 0.1° to 2.5°, for example 0.2° to 0.5°, is preferably achieved.

A continuous tapering of fibers 121 is provided, corresponding to the shape of the gap between fiber supports 20, 21. Abrupt transitions, which represent potential mechanical weak points, are avoided due to the continuous transition between a useful cross-sectional shape for injection into fibers 121 and a useful cross-sectional shape for guiding light into fibers 121.

The two fiber supports 20, 21 may have similar, in particular identical, properties with regard to their material. Second fiber support 21 is preferably made of a glass which, compared to the type of glass or the types of glass of which fibers 121 are made, has a lower hardness at room temperature and/or a comparable coefficient of thermal expansion and/or a higher softening temperature.

Figure 6:
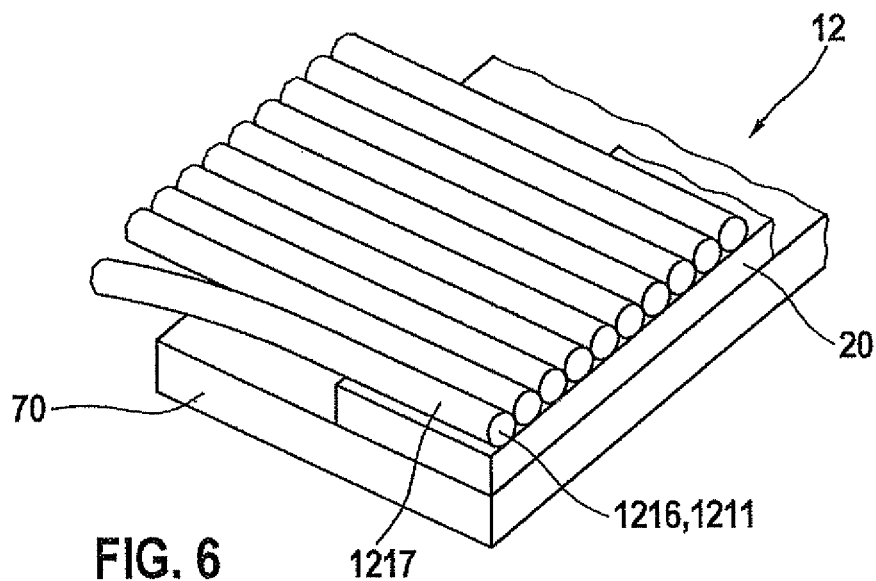
FIGS. 6, 7a, 7b, 7c, 7d, 7e, 7f, 7g, 7h, and 7i schematically show the production of a light source as an example.

The production of a light source 10 is explained below as an example, with reference to FIG. 6. The starting point is a fiber support 20 having a height of 1 mm, a length of 5 mm, and a width of 14 mm. Optical fibers 121 which have circular end faces 1216 and circular cross-sectional areas, and a length of approximately 1000 mm and a diameter of approximately 70 µm, are arranged along the entire width of fiber support 20, whereby in the region of fiber support 20, fibers 121 are situated in a layer and in abutment along their lateral surface areas 1217; i.e., in the region of their first ends 1211, all fibers 121 or almost all fibers 121, for example more than 90% of fibers 121, directly contact adjacent fibers 121 along their lateral surface area 1217. This results in the configuration of approximately 200 fibers 121.

Fibers 121 are aligned relative to one another and relative to fiber support 20, for example by making use of a common stop surface (not shown), in such a way that end faces 1216 of fibers 121 are in flush abutment with one another and with fiber support 20.

Heating of fibers 121 arranged on fiber support 20 is carried out using a heating device 70, for example with the aid of an electrical resistance heater, for example to a temperature of 550° C. to 800° C.; in the example, the heat generated by heating device 70 arrives at fibers 121 through fiber support 20. The heating of fibers 121 and of fiber support 20 results in a formation of an integral connection between fibers 121 and fiber support 20.

Figure 7A:
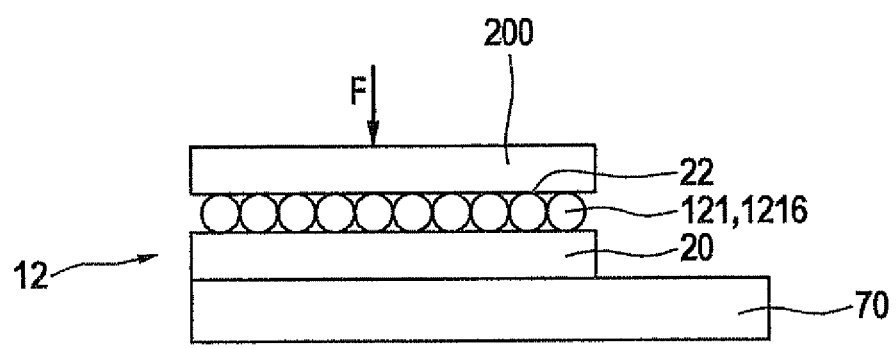
Figure 7B:
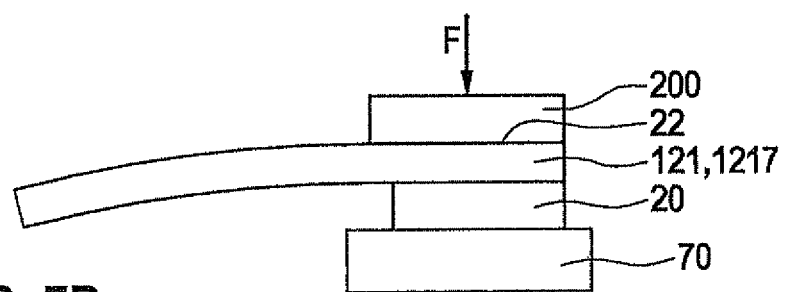

In one alternative specific embodiment of the method, as illustrated in FIGS. 7a and 7b, the formation of a connection between fiber support 20 and fibers 121 is assisted and accelerated in that on the side of fibers 121 facing away from fiber support 20, a countersurface 22 of a tool 200 is brought into contact with fibers 121 under the action of a force F. Thus, a force is also generated between fiber support 20 and fibers 121. To prevent a connection from also forming between fibers 121 and countersurface 22, the latter is to be formed from at least one heat-resistant material, for example SiC, which also does not bond to glass under the action of heat and pressure.

Figure 7C:
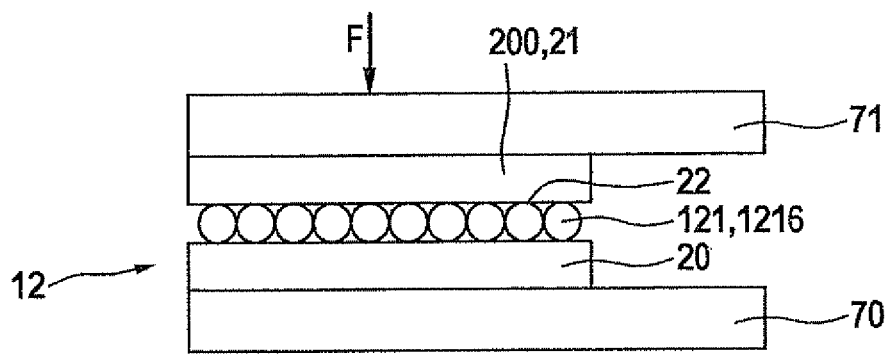
Figure 7D:
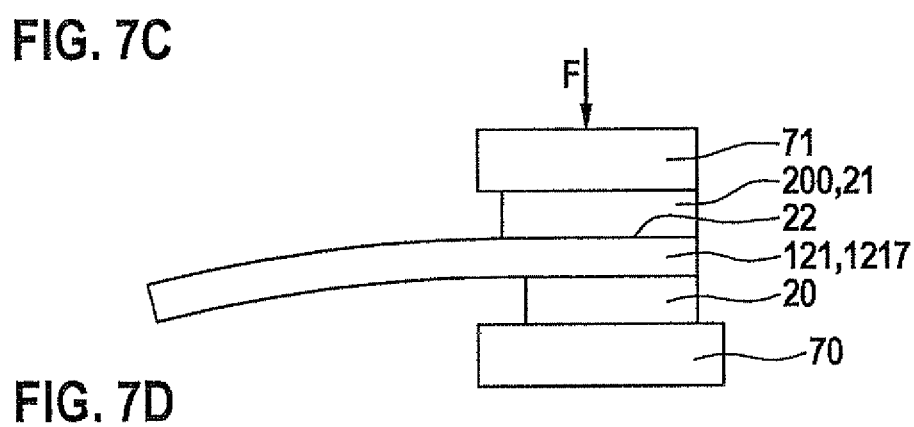

Alternatively, the formation of a connection between countersurface 22 and fibers 121 may be desired, in particular when the countersurface, as shown in FIGS. 7c and 7d, is part of a second fiber support 21. In this case, the heat supply may be improved with the aid of a second heating device 71, for example a second electrical resistance heater, which is situated on the side of the composite of fibers 121 and fiber supports 20, 21 facing away from first electrical resistance heater 70.

Figure 7E:
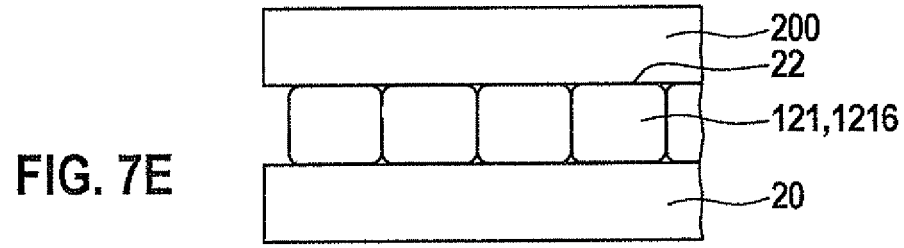
Figure 7F:
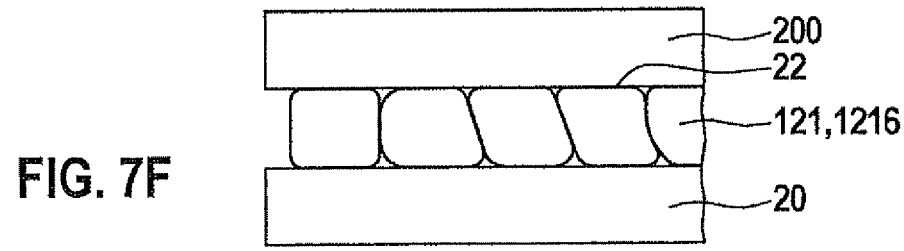

In one alternative specific embodiment of the method, the continued heating of fibers 121 is associated with softening of fibers 121, and/or under the action of the force introduced by countersurface 22 results in deformation of fibers 121 in the region of their first ends 1211. As shown in FIG. 7e, it is noted that the initially circular cross-sectional areas of fibers 121 are flattened in the regions in which fibers 121 contact one another or contact fiber support 20 or countersurface 22; i.e., the curvature of lateral surface areas 1217 of fibers 121 decreases in these regions (increase in the radius of curvature), while the curvature increases in still free regions of lateral surface areas 1217 of fibers 121 (decrease in the radius of curvature). If the action of heat and force is continued, fibers 121 are further deformed in the region of their first ends 1211 as long as the space between fiber support 20 and countersurface 22 is at least largely completely filled by fibers 121 (FIG. 7e). Fibers 121 then have rectangular cross sections in the region of their first ends, in particular having a lateral ratio of π/4; otherwise, cross-sectional areas of fiber 121 with less uniform shapes, for example trapezoidal cross sections or curved cross sections, may result (FIG. 7f).

Figure 7G:
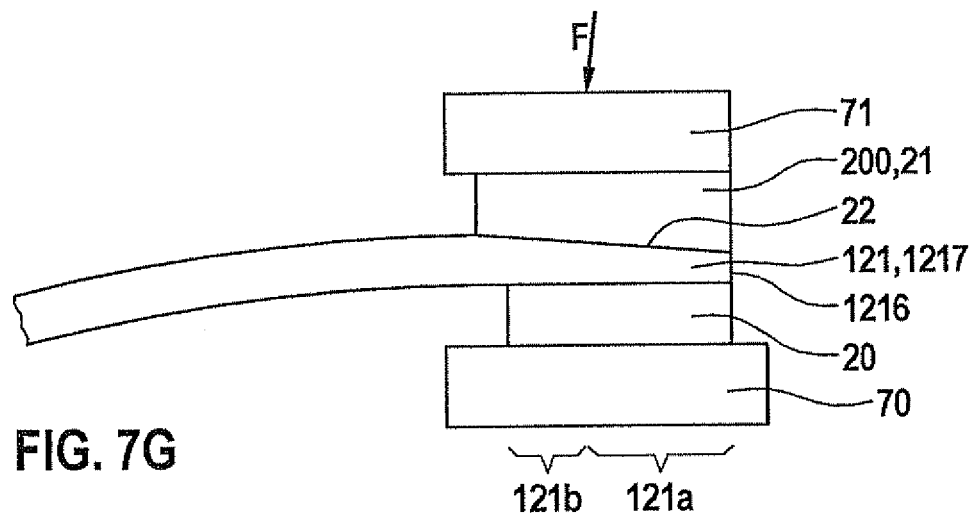
Figure 7H:
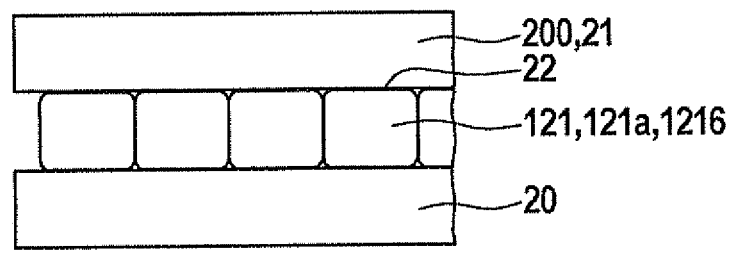
Figure 7I:
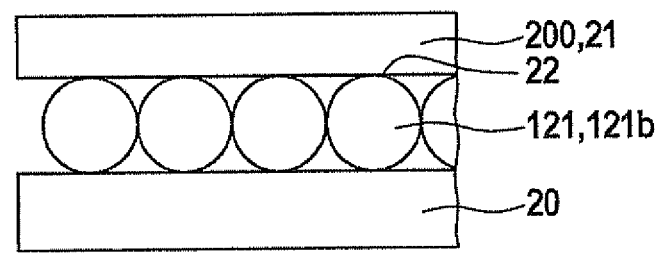

In another specific embodiment, as is apparent in FIGS. 7g, 7h, and 7i, it is provided that fibers 121 are more intensely pressed in a first subregion 121a, which includes end faces 1216 of fibers 121, than in a second subregion 121b, second subregion 121b being separated at a distance from end faces 1216 of fibers 121. For example, fibers 121 in first subregion 121a are pressed so intensely that they have almost rectangular end faces 1216 (FIG. 7h) after the pressing operation. In this example, fibers 121 in second subregion 121b are pressed so lightly that they maintain almost circular cross-sectional areas in second subregion 121b (FIG. 7i).

For this purpose, it is provided that countersurface 22 defines an angle of 0.1° to 2.5° relative to the support surface of fibers 121 on fiber support 20. Alternatively or additionally, it is provided that the force acting on the fibers via countersurface 22 defines an angle of 0.1° to 2.5° relative to the normal of the support surface of fibers 121 on fiber support 20, resulting in nonuniform pressing of fibers 121.

The production of a single light source 10, in particular the production of a single optical fiber device 12, has been described above. Additionally or alternatively, as described below as an example, it is possible to produce multiple light sources 10, in particular multiple optical fiber devices 12, in one work step.

Figure 8A:
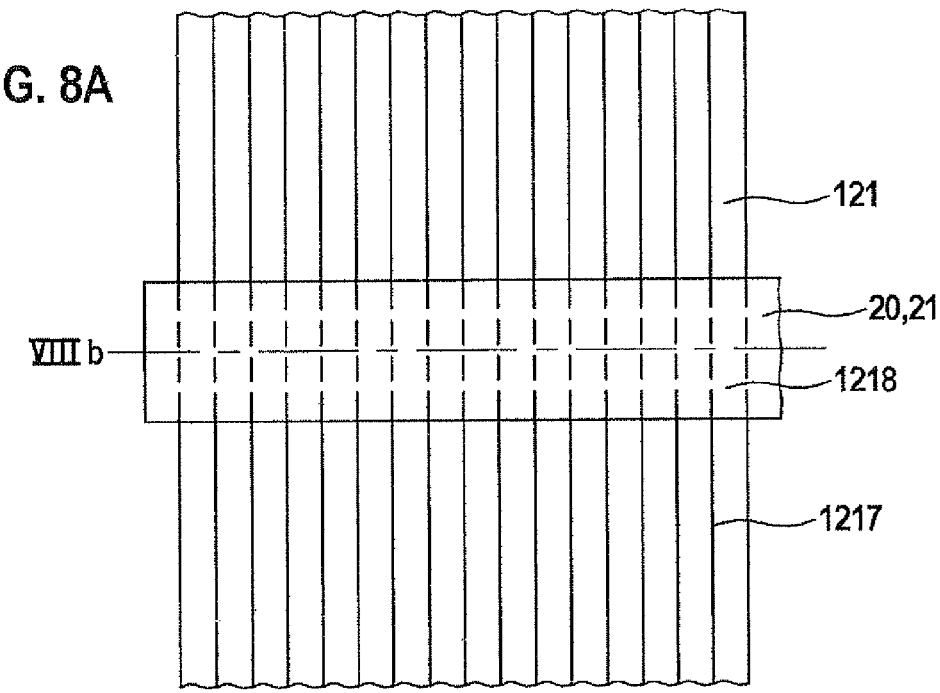
FIGS. 8a, 8b, 8c, 8d, and 8e and FIGS. 9a and 9b schematically show another example of the production of a light source.
Figure 8B:
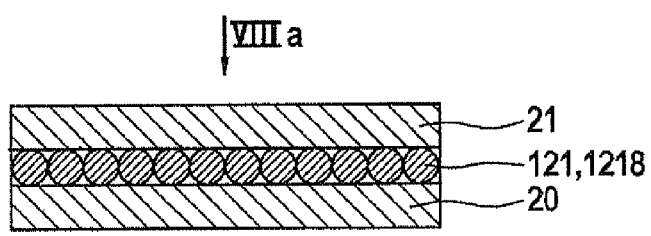

For this purpose, as illustrated in FIGS. 8a and 8b, for example a plurality of fibers 121, in particular a very large number of fibers 121, for example 1000 or more fibers 121, are adjacently arranged so that fibers 121 in a fiber section 1218 are in abutment along their lateral surface area 1217, i.e., are arranged in such a way that in the region of their first ends 1211, all fibers 121 or almost all fibers 121, for example more than 90% of fibers 121, directly contact adjacent fibers 121 along their lateral surface areas 1217 in fiber section 1218.

Fibers 121 are arranged in such a way that fiber section 1218 is situated at least approximately in the middle of fibers 121 in the longitudinal direction of fibers 121. Fibers 121 are also situated in fiber section 1218 on a fiber support 20 which is a glass plate, for example, and which has a height of approximately one millimeter, a length of several millimeters, and a width of 50 mm to 200 mm or greater. In the present example, a second fiber support 21 whose characteristics with regard to geometry and material are the same as those of fiber support 20 is placed on fibers 121, opposite first fiber support 20.

Figure 8C:
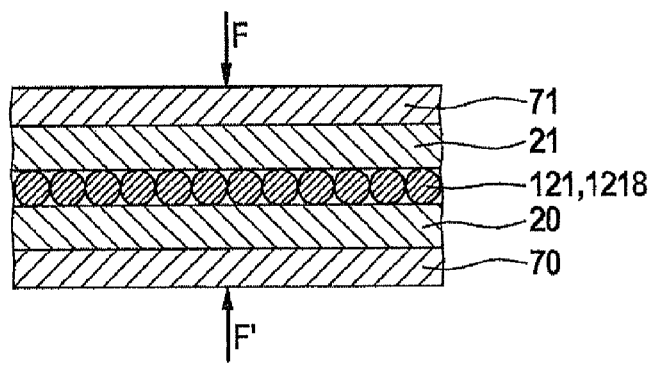

The following method steps are schematically illustrated in FIG. 8c. These method steps include heating of fiber support 20 and fiber support 21, using two heating devices 70, 71 designed as electrical resistance heaters. Thus, fibers 121 are also heated indirectly, in the present example, to 550° to 850° C. These method steps also include the action of a force F on fiber support 20 and the action of a force F' on second fiber support 21. Forces F and F' are oppositely directed, and are oriented in such a way that overall, a pressure on fibers 121, for example a pressure of 0.5 N/cm$^2$ to 50 N/cm$^2$, is exerted via the two fiber supports 20, 21.

The action of the pressure results in deformation of fibers 121 in the region between fiber support 20 and second fiber support 21, fibers 121 in the region between fiber support 20 and second fiber support 21 initially having circular cross-sectional areas, and these circular cross-sectional areas deforming as the result of the deformation of fibers 121 as described above.

Figure 8D:
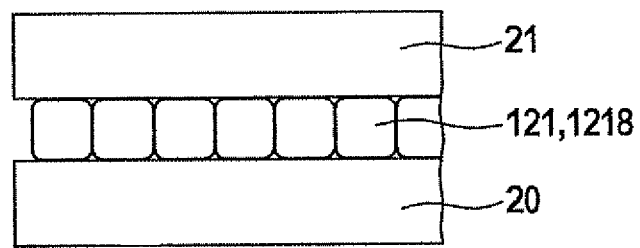
Figure 8E:
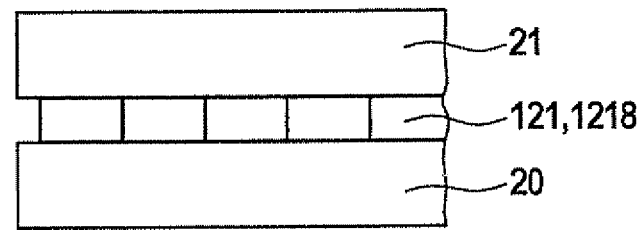

One example of appropriately deformed fibers 121 is also shown in FIG. 8d, the cross-sectional areas of fibers 121 having flattened areas in the regions in which fibers 121 contact fiber supports 20, 21 or contact one another. FIG. 8e shows another example in which fibers 121 largely fill the region between fiber support 20 and second fiber support 21, so that the totality of fibers 121 largely completely fills the space between the fiber supports. The cross sections of individual fibers 121 in the region between fiber supports 20, 21 may have a rectangular or trapezoidal shape.

Fibers 121 and fiber supports 20, 21 are subsequently cooled, resulting in solidification of fibers 121 and forming an integral connection between fibers 121 and fiber supports 20, 21.

Figure 9A:
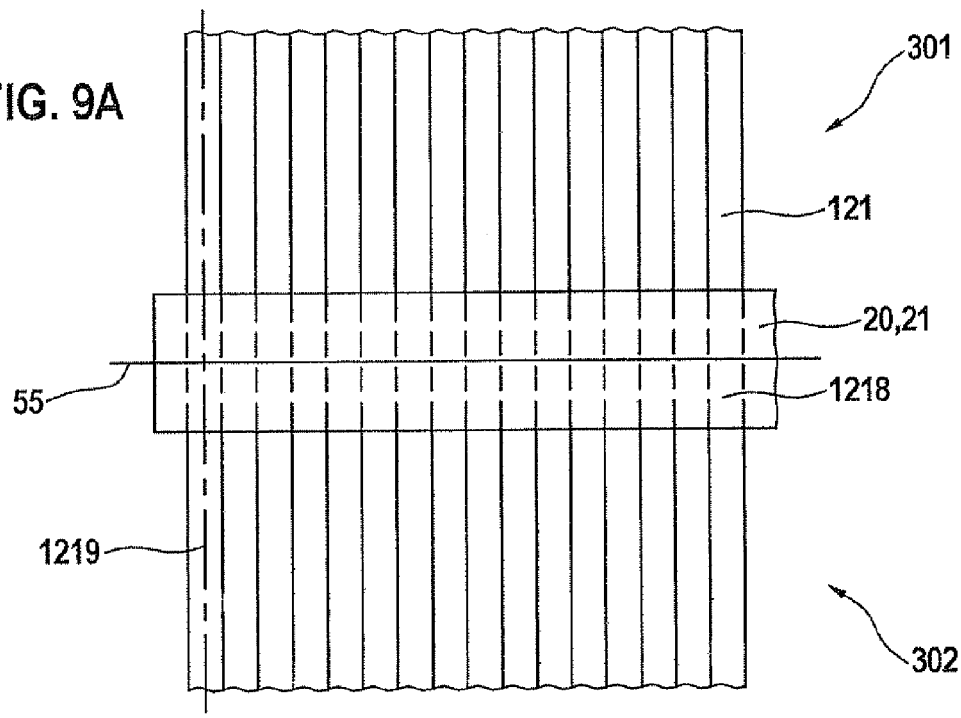

As schematically illustrated in FIG. 9a, in this example it is provided that the composite of fiber support 20, fibers 121, and second fiber support 21 is subsequently divided into two approximately equal portions 301, 302 by making a cut 55 approximately perpendicular to longitudinal axes 1219 of fibers 121 in the region of fiber section 1218 of fibers 121. Cut 55 may be made, for example, in a conventional manner using a diamond saw, by scribing and breaking, or with the aid of a laser beam, for example using an infrared laser, in particular a $CO_2$ laser.

Optionally, the two portions 300, 301 thus obtained or a plurality of portions 301, 302 thus obtained may be stacked on top of one another and jointly provided with a finish coating and/or an antireflective coating.

Resulting portions 301, 302 may be understood as two optical fiber devices 12 which are jointly produced.

Figure 9B:
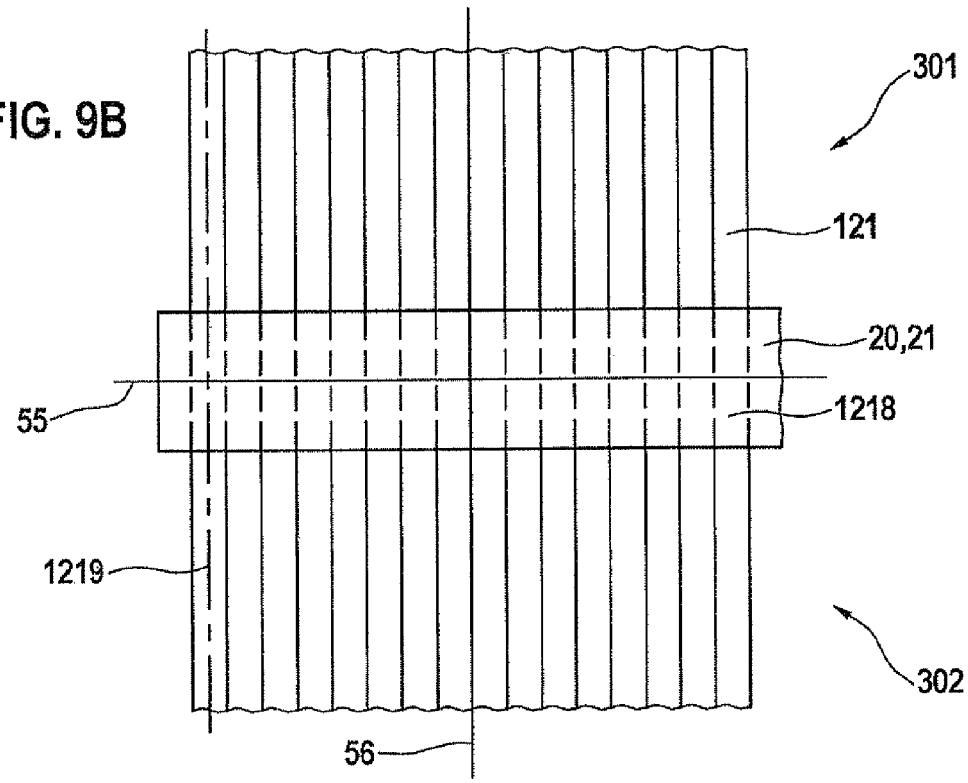

Optionally, as schematically illustrated in FIG. 9b, portions 301, 302 may also be further divided by one or multiple second cuts 56 made in the region of fiber section 1218 of fibers 121 along longitudinal axes 1219 of fibers 121, thus producing a plurality of optical fiber devices 12. Second cuts 56 may be flexibly made, in particular in such a way that the width of generated optical fiber devices 12 corresponds to the width of diode lasers 13 with which they cooperate.

Second cuts 56 may also be made the same way as cuts 55, for example using a diamond saw, by scribing and breaking, or with the aid of a laser beam, for example using an infrared laser, in particular a $CO_2$ laser.

For making the second cuts 56, it is possible in particular to stack portions 301, 302 or a plurality of portions 301, 302 so that a plurality of optical fiber devices 12 are separated in each second cut 56.

Figure 10:
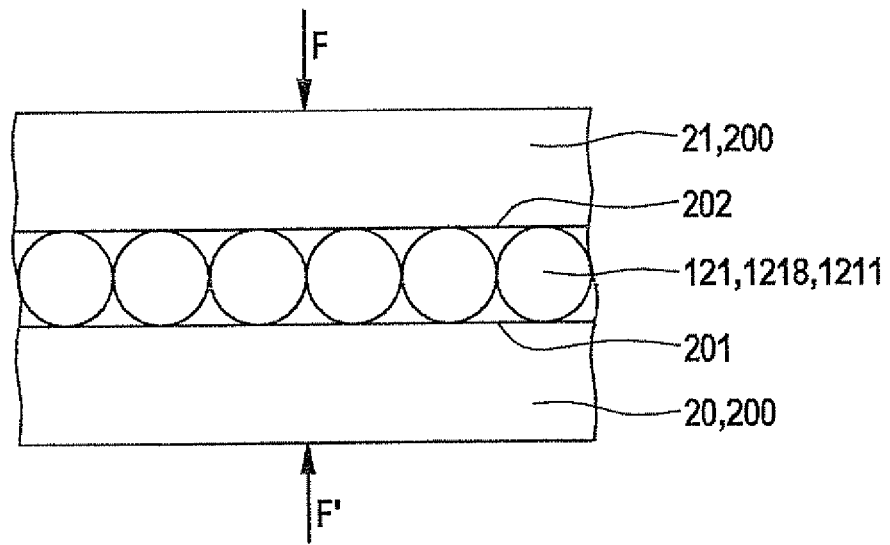
FIG. 10 shows one example of the production of a light source.

As explained above, the production of a light source 10 may be provided in such a way that deformation of heated fibers 121 results under the action of a force F on heated fibers 121 in the region of first ends 1211 of fibers 121 or in a fiber section 1218 of fibers 121, for example approximately in the middle, for example in such a way that the totality of deformed fibers 121 completely fills a region between a fiber support 20 and a second fiber support 21. Of course, it is also possible to replace fiber support 20 and/or second fiber support 21 by a tool 200, for example made of SiC, which does not bond with fibers 121 and which is removed after deformation of fibers 121. As illustrated in FIG. 10, it is important that fibers 121 are situated between two pressing surfaces 201, 202 via which force F and counterforce F' act on fibers 121. In this case, the produced device has at most one fiber support 21, not two fiber supports 21, 22. In this case it is particularly preferred to introduce first and/or second cuts 55, 56 by scribing and breaking.

In the following example, forces F and F' are selected in such a way that, although deformation of fibers 121 results, this deformation ceases when fibers 121 for the first time fill, at least largely (for example, >99.5% of the cross section), a region between pressing surfaces 201, 202. In this way a force F that is too small, which would not be sufficient for deforming fiber 121, as well as a force that is too large, which would laterally force out fibers 121 from the region between pressing surfaces 201, 202, is avoided.

In one specific case, 140 fibers made of optical flint/soda-lime glass were arranged between two pressing surfaces 201, 202 having dimensions of 15 mm*8 mm, and were heated to approximately 630° C., i.e., above the softening temperature of fibers 121. Fibers 121 were subsequently acted on by a force F. The desired behavior was observed for forces between 1 N and 35 N.

Of course, within certain limits it is possible to heat fibers 121 to a higher or lower temperature, resulting in increased or decreased flowability of fibers 121. The range of force F in which the behavior occurs that, although deformation of fibers 121 results, this deformation ceases when fibers 121 for the first time fill, at least largely (for example, >99.5% of the cross section), a region between pressing surfaces 201, 202, is shifted in the present case and may be identified by tests. In the present example, the desired behavior was achieved for forces F between 10 N and 20 N and for fiber temperatures between 590° C. and 690° C.

What is claimed is:

1. A method for producing a light source for optically exciting a laser device, the light source including a diode laser that includes a plurality of emitters, and a fiber optic device including a plurality of optical fibers, each of the optical fibers including a first end and a lateral surface area, the first ends being situated relative to the emitters in such a way that light generated by the emitters is injected into the first ends of the optical fibers, the optical fibers being situated in abutment along their lateral surface areas, at least in the region of the first ends of the optical fibers, the method comprising:

arranging a plurality of optical fibers, which form a fiber section, in a subregion, the fiber section being situated between two opposite pressing surfaces;

heating the fiber section; and exerting a force on the heated optical fibers using the pressing surfaces, the force and the heating initially resulting in deformation of the heated optical fibers, at least one of the exerted force and a temperature of the optical fibers being selected in such a way that the deformation ceases when the optical fibers for a first time fill, at least largely, a region between the pressing surfaces;

wherein one of the pressing surfaces is part of a fiber support, and another of the pressing surfaces is part of a second fiber support, resulting in formation of an integral connection between the optical fibers and the second fiber support.

2. The method as recited in claim 1, wherein the optical fibers are situated in abutment along their lateral surface areas, at least in the fiber section.

3. The method as recited in claim 1, wherein the deformation of the heated fibers ceases when more than 95% of a region between the pressing surfaces is filled.

4. The method as recited in claim 3, wherein the deformation of the heated fibers ceases when more than 99.5% of a region between the pressing surfaces is filled.

5. The method as recited in claim 1, wherein the deformation ceases while at least one of the exerted force and a temperature of the optical fibers is held largely constant.

6. The method as recited in claim 1, wherein a direct connection between the fiber support and the second fiber support is avoided.

7. The method as recited in claim 1, wherein an integral connection between the optical fibers is avoided.

8. The method as recited in claim 1, wherein the optical fibers are made of at least one first glass, and the fiber supports are made of at least one second glass, and a softening temperature of the second glass has a higher value than a softening temperature of the first glass.

9. The method as recited in claim 8, wherein the softening temperature of the second glass has a value that is 20 K to 250 K, higher than the softening temperature of the first glass.

10. The method as recited in claim 1, wherein the optical fibers are made of at least one first glass, and the fiber supports are made of at least one second glass, and a hardness at room temperature of the second glass has a higher value than a hardness at room temperature of the first glass.

11. The method as recited in claim 1, wherein at least one of the pressing surfaces is made of SiC.

12. The method as recited in claim 11, wherein both pressing surfaces are made of SiC.

13. The method as recited in claim 1, wherein the heating of the arranged optical fibers is carried out within the fiber section in which the fibers are heated across at least one, of the pressing surfaces, at least one electrical resistance heater or at least one induction heater.

* * * * *